United States Patent
Mise et al.

(10) Patent No.: US 8,698,249 B2
(45) Date of Patent: Apr. 15, 2014

(54) CMOS SEMICONDUCTOR DEVICE AND METHOD FOR MANUFACTURING THE SAME

(75) Inventors: Nobuyuki Mise, Kanagawa (JP); Takahisa Eimori, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/567,869

(22) Filed: Aug. 6, 2012

(65) Prior Publication Data

US 2013/0034953 A1   Feb. 7, 2013

Related U.S. Application Data

(62) Division of application No. 12/745,638, filed as application No. PCT/JP2008/071392 on Nov. 26, 2008, now abandoned.

(30) Foreign Application Priority Data

Dec. 3, 2007 (JP) ................................. 2007-312010

(51) Int. Cl.
  *H01L 29/76* (2006.01)
  *H01L 29/94* (2006.01)
  *H01L 31/062* (2012.01)
  *H01L 31/113* (2006.01)
  *H01L 31/119* (2006.01)

(52) U.S. Cl.
  USPC 257/369; 257/406; 257/E27.06; 257/E27.062

(58) Field of Classification Search
  USPC .......... 257/310, 350, 351, 369, 371, E21.632, 257/E21.611, 406, 411, E27.062, E27.06; 438/216, 261, 287, 591
  See application file for complete search history.

(56) References Cited

U.S. PATENT DOCUMENTS 6,897,095 B1   5/2005   Adetutu et al.
2002/0135030 A1   9/2002   Horikawa (Continued)

FOREIGN PATENT DOCUMENTS

JP   2002-280461 A   9/2002
JP   2002-359295 A   12/2002

(Continued)

OTHER PUBLICATIONS

Jung et al. ("Dual High-k Gate Dielectric Technology Using Selective AlOx Etch (SAE) Process with Nitrogen and Fluorine Incorporation", 2006 Symposium on VLSI Technology Digest of Technical Papers).*

(Continued)

*Primary Examiner* — Hoai V Pham
(74) *Attorney, Agent, or Firm* — McDermott Will & Emery LLP

(57) ABSTRACT

A CMOS semiconductor device having an n-type MOSFET and a p-type MOSFET, comprising: a gate electrode of the n-type MOSFET having a first insulation layer composed of a high-k material, and a first metal layer provided on the first insulation layer and composed of a metal material; and a gate electrode of the p-type MOSFET having a second insulation layer composed of a high-k material, and a second metal layer provided on the second insulation layer and composed of a metal material, wherein the first insulation layer and the second insulation layer are composed of the different high-k materials, and the first metal layer and the second metal layer are composed of the same metal material.

5 Claims, 21 Drawing Sheets

(56) References Cited

U.S. PATENT DOCUMENTS

| | | |
|---|---|---|
| 2002/0151125 A1 | 10/2002 | Kim et al. |
| 2005/0282329 A1* | 12/2005 | Li .................................. 438/216 |
| 2006/0001106 A1 | 1/2006 | Metz et al. |
| 2006/0022271 A1 | 2/2006 | Metz et al. |
| 2006/0180870 A1 | 8/2006 | Ichihara et al. |
| 2007/0210354 A1 | 9/2007 | Nabatame et al. |
| 2008/0160736 A1* | 7/2008 | Alshareef et al. ............. 438/585 |
| 2008/0237655 A1* | 10/2008 | Nakabayashi et al. ........ 257/255 |
| 2008/0303099 A1 | 12/2008 | Iwamoto et al. |

FOREIGN PATENT DOCUMENTS

| | | |
|---|---|---|
| JP | 2006-024594 A | 1/2006 |
| JP | 2006-222385 A | 8/2006 |
| JP | 2007-080913 A | 3/2007 |
| JP | 2007-243009 A | 9/2007 |
| WO | WO-2005/114718 A1 | 12/2005 |
| WO | WO-2006/012311 A1 | 2/2006 |
| WO | WO-2006/028577 A2 | 3/2006 |

OTHER PUBLICATIONS

Alshareef et al. ("Thermally Stable N-Metal Gate MOSFETs Using La-Incorporated HfSiO Dielectric", 2006 Symposium on VLSI Technology Digest of Technical Papers).*

Chang et al. ("Effects of Al2O3 Dielectric Cap and Nitridation on Device Performance, Scalability, and Reliability for Advanced High-k/Metal Gate pMOSFET Applications", IEEE Trans. on Elec. Devices, vol. 54, No. 10, Oct. 2007).*

Japanese Office Action, and partial English translation thereof, issued in Japanese Patent Application No. 2009-544638 mailed Oct. 2, 2012.

Wang, X.P. et al. "Turning Effective Metal Gate Work Function by a Novel Gate Dielectric HfLaO for nMOSFETs." IEEE Electron Device Letters. vol. 27 / No. 1. pp. 31-33. Jan. 2006.

von Haartman, Martin et al. "Comprehensive Study on Low-Frequency Noise and Mobility in Si and SiGe pMOSFETs with High-κ Gate Dielectrics and TiN Gate." IEEE Transaction on Electron Devices. vol. 53 / No. 4. pp. 836-843. Apr. 2006.

Chinese Office Action issued in Application No. 200880119004.4 dated Sep. 2, 2013.

Hyung-Suk Jung et al; Dual High-k Gate Dielectric Technology Using Selective AlOX Etch (SAE) Process with Nitrogen and Fluorine Incorporation; 2006 Symposium on VLSI Technology Digest of Technical Papers; 2006 IEEE.

H.N. Alshareef et al; Thermally Stable N-Metal Gate MOSFETs Using La-Incorporated HfSiO Dielectric; 2006 Symposium on VLSI Technology Digest of Technical Papers, 2006 IEEE.

* cited by examiner

CMOS SEMICONDUCTOR DEVICE AND METHOD FOR MANUFACTURING THE SAME

RELATED APPLICATIONS

This application is a Divisional of U.S. application Ser. No. 12/745,638, filed on Jun. 1, 2010, now abandoned which is the U.S. National Phase under 35 U.S.C. §371 of International Application No. PCT/JP2008/071392, filed on Nov. 26, 2008, which in turn claims the benefit of Japanese Application No. 2007-312010, filed on Dec. 3, 2007, the disclosures of which Applications are incorporated by reference herein.

TECHNICAL FIELD

The present invention relates to a CMOS semiconductor device and a method for producing the same, and more particularly to a CMOS semiconductor device using a high-k material for a gate electrode and a method for producing the same.

BACKGROUND ART

Recently, as a CMOS semiconductor device is miniaturized, what is troubling is that a gate insulation layer composed of SiON or $SiO_2$ becomes thin and a leak current goes through the gate insulation layer due to a tunneling phenomenon.

To solve this problem, a high-k material (high-dielectric material) such as hafnium is used for the gate insulation layer and a thickness of the gate insulation layer is set to a constant value to prevent the leak current from being generated. In addition, when the high-k material is used for a gate electrode, Fermi level pinning is generated at a boundary with a silicon gate electrode, so that as a gate electrode material, a metal such as nickel silicide is used instead of polycrystalline silicon.

For example, when the high-k material is used for the gate insulation layer, NiSi is used for a metal gate electrode of a p-channel MOSFET, and $Ni_2Si$ is used for a metal gate electrode of an n-channel MOSFET.

Patent document 1: Japanese Unexamined Patent Publication No. 2002-359295

DISCLOSURE OF THE INVENTION

Problems to be Solved by the Invention

In the CMOS semiconductor device, it is necessary to control a gate length Lg with a high degree of accuracy to control threshold voltages of the p-channel MOSFET and the n-channel MOSFET. When the gate length Lg is 20 nm, for example, allowable LWR (Line Width Roughness) of the gate length is about 5%, which means about 1 nm.

However, the gate electrodes composed of different materials such as NiSi and $Ni_2Si$ cannot be processed with a high degree of accuracy in the same etching step, that is, in one etching step using one kind of etching gas, so that a side wall of the electrode is tapered in general.

On the other hand, when the two gate electrodes composed of different materials are processed in different etching steps, etching masks cannot be aligned due to a fine structure in which the gate length Lg is as small as 20 nm.

Thus, it is an object of the present invention to provide a CMOS semiconductor device capable of controlling a gate length with a high degree of accuracy in the CMOS semiconductor device using a high-k material, and a production method for producing the same.

Means for Solving the Problem

Therefore, the present invention is a CMOS semiconductor device having an n-type MOSFET and a p-type MOSFET, comprising: a gate electrode of the n-type MOSFET having a first insulation layer composed of a high-k material, and a first metal layer provided on the first insulation layer and composed of a metal material; and a gate electrode of the p-type MOSFET having a second insulation layer composed of a high-k material, and a second metal layer provided on the second insulation layer and composed of a metal material, wherein the first insulation layer and the second insulation layer are composed of the different high-k materials, and the first metal layer and the second metal layer are composed of the same metal material.

Furthermore, the present invention is a method for producing a CMOS semiconductor device having an n-type MOSFET and a p-type MOSFET, comprising the steps of: preparing a semiconductor substrate defined by an n-type MOSFET formation region and a p-type MOSFET formation region; forming a high-k material layer, a first cap layer, and a first metal layer, sequentially on the semiconductor substrate; removing the first cap layer and the first metal layer except for those in the p-type MOSFET formation region; forming a second cap layer and a second metal layer, sequentially on the semiconductor substrate; removing the second metal layer except for that in the n-type MOSFET formation region; removing the second cap layer provided between the n-type MOSFET formation region and the p-type MOSFET formation region, using the first metal layer and the second metal layer as masks; removing the first metal layer and the second metal layer; forming a gate metal material layer on the semiconductor substrate; and forming a gate metal layer of a gate electrode of each of the n-type MOSFET and the p-type MOSFET by etching the gate metal material layer in the same etching step.

Effect of the Invention

The CMOS semiconductor device according to the present invention can control a threshold voltage with a high degree of accuracy.

In addition, according to the method for producing a CMOS semiconductor device in the present invention, since the gate metal layer of the gate electrode each of the n-type MOSFET and the p-type MOSFET can be formed in the same etching step, the gate electrode can be processed with a high degree of accuracy.

EXPLANATION OF REFERENCES 1, 11, 21 . . . insulation layer, 12, 22 . . . cap layer, 13, 14, 23, 24 . . . metal layer, 10, 20 . . . gate electrode, 100 . . . CMOS semiconductor device, 101 . . . n-type MOSFET, 102 . . . p-type MOSFET, 105 . . . semiconductor substrate, 110 . . . n-well region, 120 . . . p-well region, 111, 121 . . . gate/source regions, 130 . . . element isolation layer

BEST MODE FOR CARRYING OUT THE INVENTION

Hereinafter, preferred embodiments of the present invention will be described with reference to the drawings. In addition, while "upper", "lower", "left" and "right", and names including these terms are occasionally used in the following descriptions, these directions are used to easily understand the present invention with reference to the drawings, so that a configuration where the embodiment is vertically inverted or rotated in a certain direction may be included in the technical scope of the present invention as a matter of course.

First Embodiment

Figure 1:
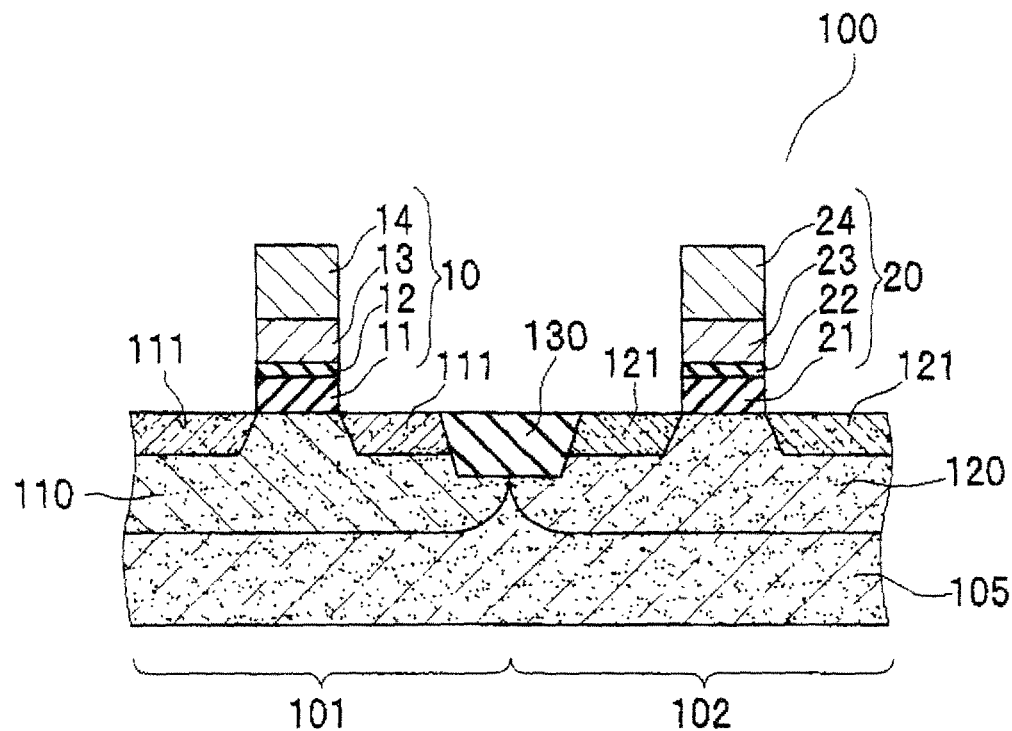
FIG. 1 is a cross-sectional view of a CMOS semiconductor device according to a first embodiment.

FIG. 1 is a cross-sectional view of a CMOS semiconductor device (complementary metal oxide semiconductor device) represented by 100 as a whole according to a first embodiment.

The CMOS semiconductor device 100 includes an n-type MOSFET 101 and a p-type MOSFET 102.

The CMOS semiconductor device 100 includes a semiconductor substrate 105 composed of silicon, for example. An n-type well region 110 and a p-type well region 120 are provided in the semiconductor substrate 100. The n-type well region 110 and the p-type well region 120 are insulated by an interlayer insulation layer 130 composed of silicon oxide, for example.

Source/drain regions 111 are provided in the n-type well region 110. A gate electrode 10 is provided on a channel region sandwiched between the source/drain regions 111. The gate electrode 10 includes a gate insulation layer 11, a cap layer 12, and gate metal layers 13 and 14 provided thereon. The gate insulation layer 11 is composed of a high-k material such as HfLaO or HfMgO, and the cap layer 12 is composed of MgO or LaO, for example. In addition, the gate metal layer 13 is composed of a mid-gap material having high heat resistance such as TiN, TaN, TaSiN, NiSi, PtSi, or $CoSi_2$, and the gate metal layer 14 is made of a low resistance material such as W.

Meanwhile, source/drain regions 121 are provided in the p-type well region 120. A gate electrode 20 is provided on a channel region sandwiched between the source/drain regions 121. The gate electrode 20 includes a gate insulation layer 21, a cap layer 22, and gate metal layers 23 and 24 provided thereon. The gate insulation layer 21 is composed of a high-k material such as HfAlO, and the cap layer 22 is composed of AlO, for example. In addition, the gate metal layers 23 and 24 are composed of the same materials as those of the gate metal layers 13 and 14 of the n-type MOSFET 101, respectively.

The gate electrode can be processed with a high degree of accuracy, and a threshold voltage can be easily and correctly controlled in the CMOS semiconductor device 100. The LWR of a gate length Lg can be 5% or less.

Specific structures of the gates of the CMOS semiconductor device 100 are as follows, for example.

n-type MOSFET: W/TiN/MgO (or LaO)/HfSiON/Si substrate p-type MOSFET: W/TiN/AlO/HfSiON/Si substrate A method for producing the CMOS semiconductor device 100 according to the first embodiment will be described with reference to FIGS. 1A to 1K. The same reference as that in FIG. 1 represents the same or corresponding part in the drawings. The production method includes the following step 1 to step 9.

Figure 1A:
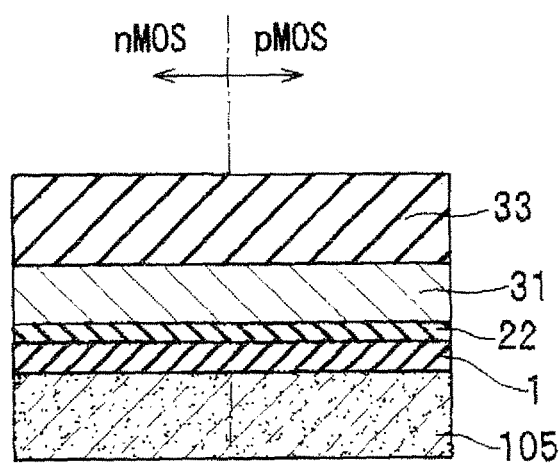
FIG. 1A is a cross-sectional view of a production step of the CMOS semiconductor device according to the first embodiment.

Step 1: As shown in FIG. 1A, the semiconductor substrate 105 composed of silicon is prepared. As described in FIG. 1A, the n-type MOSFET 101 is formed on the left side, and the p-type MOSFET 102 is formed on the right side. In addition, the semiconductor substrate 105 is omitted after FIG. 1B.

Then, a silicon oxide film (not shown) having a film thickness of 1 nm or less is formed on the semiconductor substrate 105, and then an insulation layer 1 is formed thereon. The insulation layer 1 is composed of a high-k (high-dielectric) material such as HfSiON. The insulation layer 1 is formed by an ALD method, a MOCVD method, a sputtering method, or the like. According to need, a nitriding treatment or a heat treatment may be performed in the middle of or after this process.

The cap layer 22 composed of $Al_2O_3$ is formed on the insulation layer 1. The cap layer 22 is about 1 nm in thickness, and made by the ALD method, the MOCVD method, the sputtering method, or the like. According to need, a heat treatment may be performed.

Then, a first TiN layer 31 is formed to be about 10 nm in thickness on the cap layer 22, and then a SiN layer 33 is formed to be about 10 nm in thickness. These are formed by the sputtering method, a CVD method, or the like.

Figure 1B:
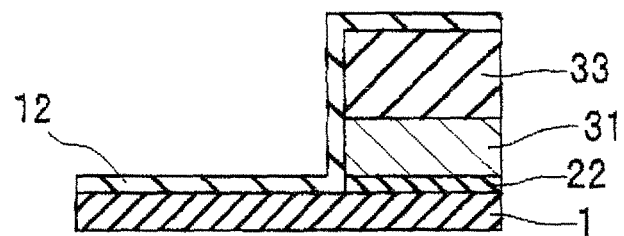
FIG. 1B is a cross-sectional view of a production step of the CMOS semiconductor device according to the first embodiment.

Step 2: As shown in FIG. 1B, the SiN layer 33 in an n-MOSFET formation region is removed by dry etching using a photoresist (not shown) as an etching mask, for example. Then, the photoresist mask is removed, and the first TiN layer 31 and the cap layer 22 are removed by wet etching with $H_2O_2$, using the SiN layer 33 as an etching mask. The insulation layer 1 is hardly damaged through the above steps.

Then, the cap layer 12 composed of MgO or LaO is formed by the ALD method, the MOCVD method or the sputtering method, for example. The film thickness of the cap layer 12 is about 1 nm, but this is not necessarily the same as that of the cap layer 22 in a p-MOSFET formation region.

In addition, a HfO layer may be further formed on the cap layers 12 and 22. In this case, the gate insulation layer has a structure of HfO/MgO/HfSiON in the n-type MOSFET, and the gate insulation layer has a structure of HfO/AlO/HfSiON in the p-type MOSFET.

Figure 1C:
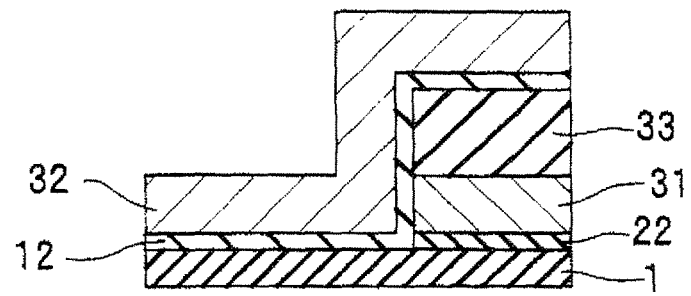
FIG. 1C is a cross-sectional view of a production step of the CMOS semiconductor device according to the first embodiment.

Step 3: As shown in FIG. 1C, a second TiN layer 32 is formed to be about 10 nm in thickness by the sputtering method or the CVD method, for example.

In addition, although the first and second TiN layers 31 and 32 are needed in the production steps, they do not remain in a final product. Therefore, they are preferably formed of the material which can be easily formed, high in selectivity, and easily removed. For example, polycrystalline Si may be used instead of TiN.

Figure 1D:
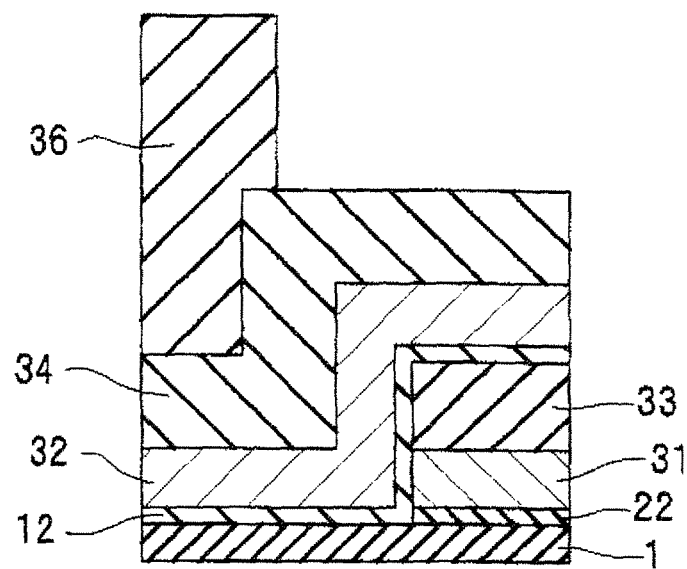
FIG. 1D is a cross-sectional view of a production step of the CMOS semiconductor device according to the first embodiment.

Step 4: As shown in FIG. 1D, a SiN layer 34 is formed to be about 10 nm in thickness by the sputtering method or the CVD method, for example. Then, a resist mask 36 is formed in the n-MOSFET formation region.

Figure 1E:
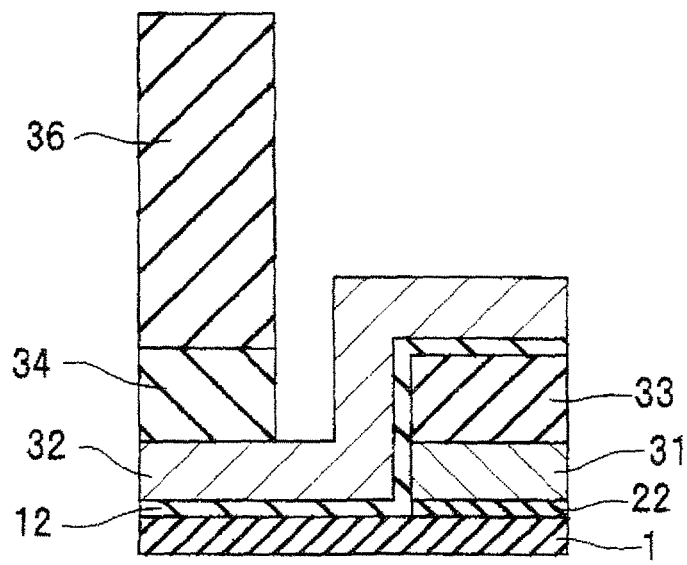
FIG. 1E is a cross-sectional view of a production step of the CMOS semiconductor device according to the first embodiment.

Step 5: As shown in FIG. 1E, the SiN layer 34 is selectively etched using the resist mask 36 as an etching mask. The etching stops on the second TiN layer 32.

Figure 1F:
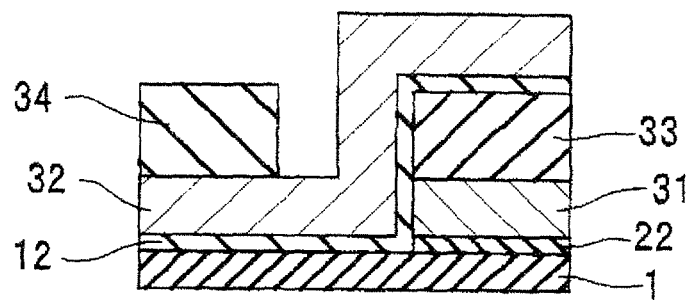
FIG. 1F is a cross-sectional view of a production step of the CMOS semiconductor device according to the first embodiment.

Step 6: As shown in FIG. 1F, the resist mask 36 is selectively removed by plasma asking or the like.

Figure 1G:
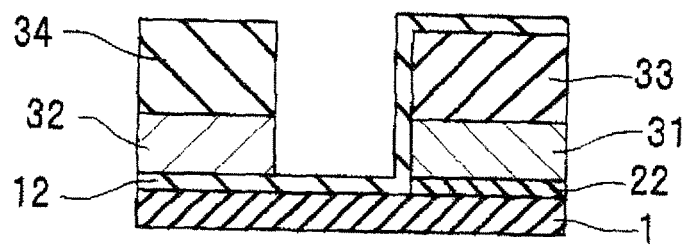
FIG. 1G is a cross-sectional view of a production step of the CMOS semiconductor device according to the first embodiment.

Step 7: As shown in FIG. 1G, the second TiN layer 32 is selectively removed using the SiN layer 34 as an etching mask.

Figure 1H:
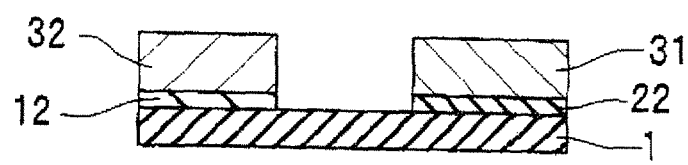
FIG. 1H is a cross-sectional view of a production step of the CMOS semiconductor device according to the first embodiment.

Step 8: As shown in FIG. 1H, the SiN layers 33 and 34 and the exposed cap layer 12 are removed by wet etching.

Figure 1I:
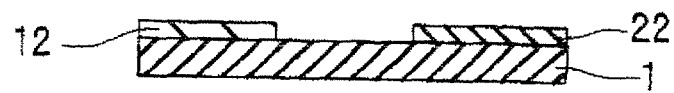
FIG. 1I is a cross-sectional view of a production step of the CMOS semiconductor device according to the first embodiment.

Step 9: As shown in FIG. 1I, the first and second TiN layers 31 and 32 are selectively removed by wet etching with $H_2O_2$, for example.

Figure 1J:
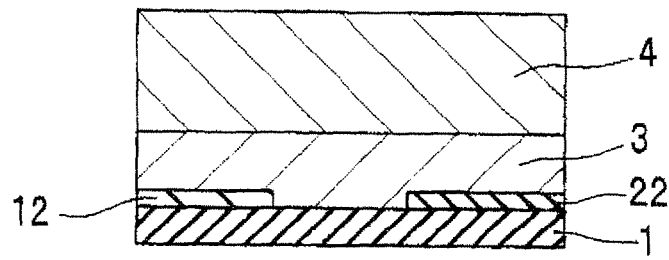
FIG. 1J is a cross-sectional view of a production step of the CMOS semiconductor device according to the first embodiment.

Step 10: As shown in FIG. 1J, a TaN layer 3 composed of a mid-gap material having high heat resistance is formed to be 30 nm or less in thickness by a sputtering method, for example. As the mid-gap material, TiN may be used instead of TaN.

Then, a low-resistance tungsten layer 4 is formed on the TaN layer 3 by a sputtering method, for example. Its film thickness is 50 nm, for example.

Step 11: Finally, as shown in FIG. 1K, the tungsten layer 4, the TiN layer 3, the cap layers 12 and 22, and the insulation layer 1 are etched using a hard mask (not shown) composed of SiN as an etching mask, whereby the gate electrode 10 of the n-type MOSFET and the gate electrode 20 of the p-type MOSFET are formed.

Figure 1K:
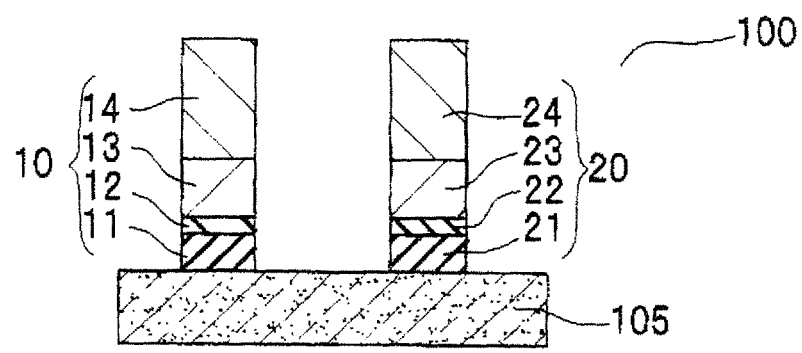
FIG. 1K is a cross-sectional view of a production step of the CMOS semiconductor device according to the first embodiment.

In the above steps, the CMOS semiconductor device 100 is formed as shown in FIG. 1K.

In addition, although not described in the above, the well region, the interlayer insulation layer, and the source/drain regions are formed by the same production steps as those of the conventional CMOS semiconductor device.

As described above, since the metal layers (the tungsten layer 4 and the TaN layer in this case) of the gate electrodes of the n-MOSFET and the p-MOSFET are made of the same material, in the steps of producing the CMOS semiconductor device 100 according to this embodiment, they can be etched in the same etching step (step 11 in this case). Therefore, a fine gate electrode having a gate length which is as small as 20 nm, for example, can be etched with a high degree of accuracy.

That is, according to the production method according to this first embodiment, since the gate metal layers for the n-type MOSFET and the p-type MOSFET are made of the same material, the controllability can be improved as compared with the case where different materials are etched at the same time.

For example, when the material of the gate metal layer is different from each other, its etched shape differs from each other, and the selectivity with the lower insulation layer (high-k material) becomes low. When the etched shape is different, a gate length and a channel length are different between the n-type MOSFET and the p-type MOSFET. In addition, when the selectivity becomes low, the semiconductor substrate 1 is also etched.

In addition, since the metal used to form the gate electrode finally is directly formed on the high-k material (insulation layer) such as HfSiON, a part of an element isolation region made of STI or the like is not etched by the etching step. Thus, preferable element isolation characteristic can be obtained.

Second Embodiment

Figure 2A:
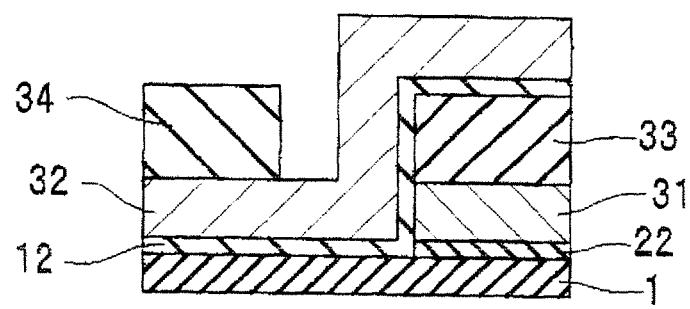
FIG. 2A is a cross-sectional view of a production step of a CMOS semiconductor device according to a second embodiment.
Figure 2B:
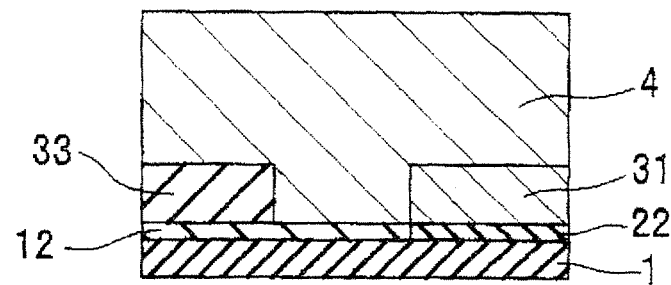
FIG. 2B is a cross-sectional view of a production step of the CMOS semiconductor device according to the second embodiment.
Figure 2C:
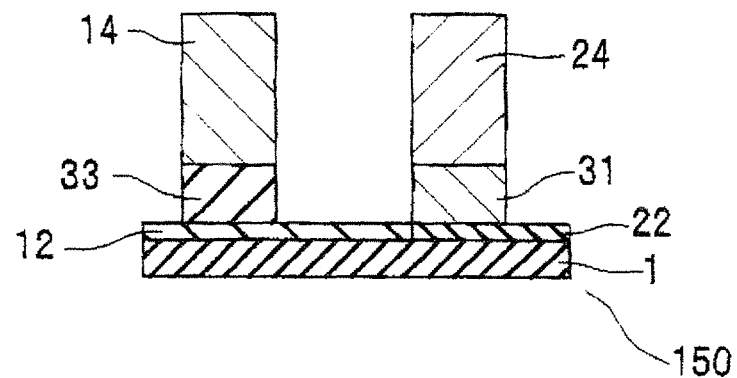
FIG. 2C is a cross-sectional view of a production step of the CMOS semiconductor device according to the second embodiment.

A method for producing a CMOS semiconductor device according to a second embodiment is shown in FIGS. 2A to 2C.

According to this production method, a structure shown in FIG. 2A is provided through the same steps as those shown in FIGS. 1A to 1F.

Then, as shown in FIG. 2B, the second TiN layer 32 and the cap layer 12 are etched by selective etching using the SiN layer 34 as an etching mask.

Then, the tungsten layer 4 is formed on the whole surface by the CVD method or the sputtering method, for example.

Then, as shown in FIG. 2C, the tungsten layer 4, and the TiN layers 31 and 33 are etched using a hard mask (not shown) composed of SiN, for example, as an etching mask, whereby gate electrodes of the n-type MOSFET and the p-type MOSFET are formed.

In the above steps, a CMOS semiconductor device 150 is formed as shown in FIG. 2C.

Third Embodiment

FIGS. 3A to 3H show a method for producing a CMOS semiconductor device according to a third embodiment. The production method includes the following steps 1 to 8. According to this production method, the SiN layers 33 and 34 formed in the production method shown in FIGS. 1A to 1K in the first embodiment are not formed. In the drawings, the same references as those in FIGS. 1A to 1K show the same or corresponding parts.

Figure 3A:
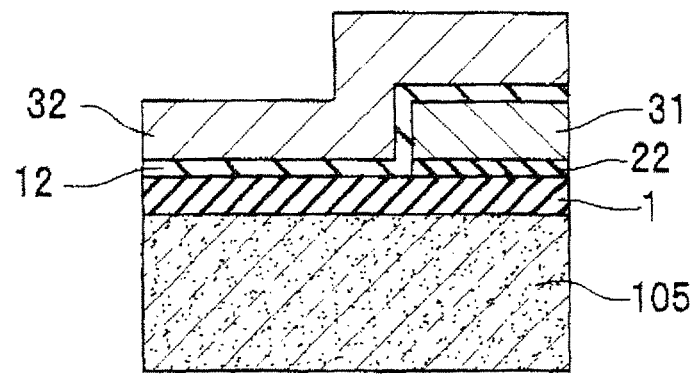
FIG. 3A is a cross-sectional view of a production step of a CMOS semiconductor device according to a third embodiment.

Step 1: As shown in FIG. 3A, the insulation layer 1 composed of HfSiON, for example, and the cap layers 12 and 22, and TiN layers 31 and 32 are formed on the semiconductor substrate 105 (omitted after FIG. 3B). These layers are made by roughly the same steps as those in FIGS. 1A to 1C except for the step of forming the SiN layer 33.

Figure 3B:
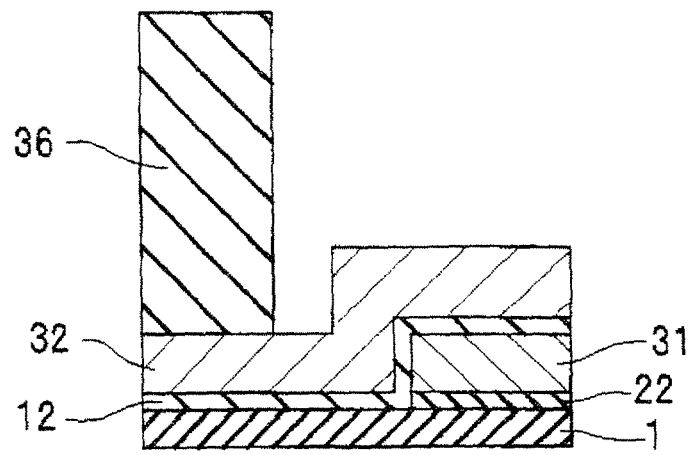
FIG. 3B is a cross-sectional view of a production step of the CMOS semiconductor device according to the third embodiment.

Step 2: As shown in FIG. 3B, the photoresist mask 36 is formed in the n-MOSFET formation region.

Figure 3C:
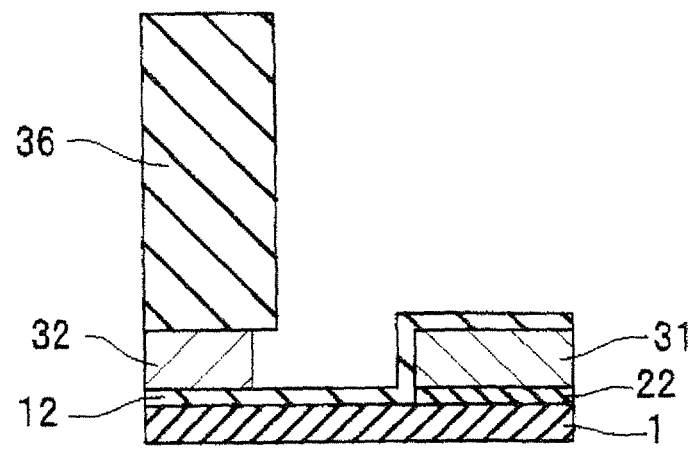
FIG. 3C is a cross-sectional view of a production step of the CMOS semiconductor device according to the third embodiment.

Step 3: As shown in FIG. 3C, the TiN layer 32 is selectively removed by wet etching with $H_2O_2$, for example, using the resist mask 36 as an etching mask.

Figure 3D:
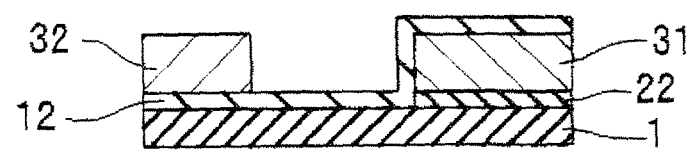
FIG. 3D is a cross-sectional view of a production step of the CMOS semiconductor device according to the third embodiment.

Step 4: As shown in FIG. 3D, the resist mask 36 is removed by an ashing method. In this step, a surface of the cap layer 12 is exposed to an ashing environment.

Figure 3E:
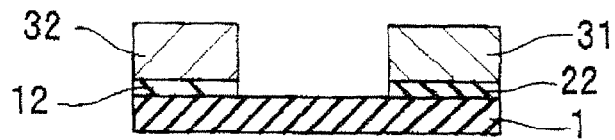
FIG. 3E is a cross-sectional view of a production step of the CMOS semiconductor device according to the third embodiment.

Step 5: As shown in FIG. 3E, the cap layer 12 on the insulation layer 1 is removed by wet etching using the TiN layers 31 and 32 as etching masks.

Figure 3F:
FIG. 3F is a cross-sectional view of a production step of the CMOS semiconductor device according to the third embodiment.

Step 6: As shown in FIG. 3F, the TiN layers 31 and 32 are selectively removed.

Figure 3G:
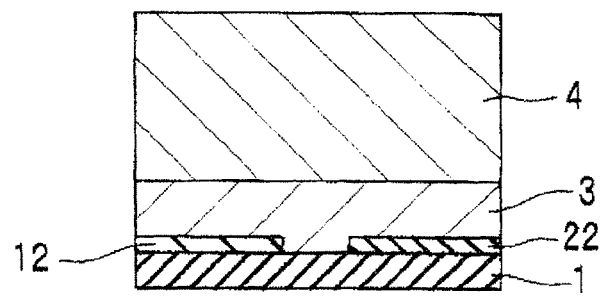
FIG. 3G is a cross-sectional view of a production step of the CMOS semiconductor device according to the third embodiment.

Step 7: As shown in FIG. 3G, the TaN layer 3 is formed to be 30 nm or less in thickness by a sputtering method, for example. Here, TiN may be used instead of TaN. Then, the low-resistance tungsten layer 4 is formed on the TaN layer 3 by a sputtering method, for example. Its film thickness is 50 nm, for example.

Figure 3H:
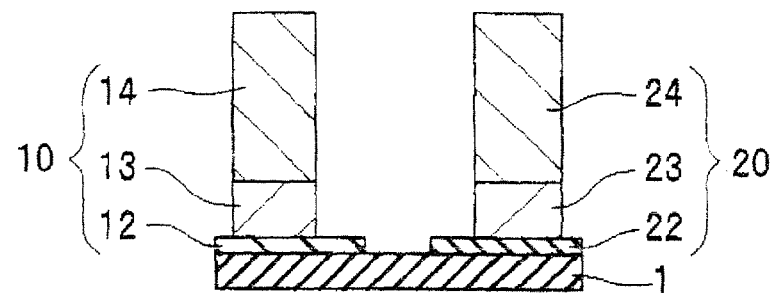
FIG. 3H is a cross-sectional view of a production step of the CMOS semiconductor device according to the third embodiment.

Step 8: Finally, as shown in FIG. 3H, the tungsten layer 4, the TaN layer 3, and the cap layers 12 and 22 are etched using a hard mask (not shown) composed of SiN, for example, as an etching mask, whereby the gate electrode 10 of the n-type MOSFET and the gate electrode 20 of the p-type MOSFET are formed.

According to the production method, since the SiN layer is not formed, the production steps can be simplified. Meanwhile, the surface of the cap layer 12 is exposed to the ashing environment in step 4 (FIG. 3D). Therefore, the production method is preferably used in a case where the ashing step does not affect the device characteristics.

Fourth Embodiment

FIGS. 4A to 4H show a method for producing a CMOS semiconductor device according to a fourth embodiment. The production method includes the following steps 1 to 8. In the drawings, the same references as those in FIGS. 1A to 1K show the same or corresponding parts.

Figure 4A:
FIG. 4A is a cross-sectional view of a production step of a CMOS semiconductor device according to a fourth embodiment.

Step 1: As shown in FIG. 4A, the insulation layer 1 composed of HfSiON is formed on a semiconductor substrate (not shown) and then an amorphous silicon layer 40 is formed by the CVD method or the like thereon.

Figure 4B:
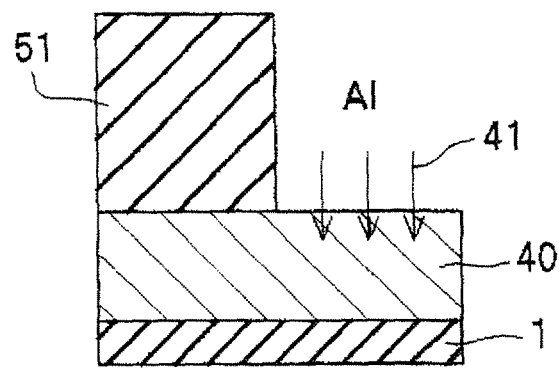
FIG. 4B is a cross-sectional view of a production step of the CMOS semiconductor device according to the fourth embodiment.

Step 2: As shown in FIG. 4B, a photoresist layer 51 is formed in the n-type MOSFET formation region. Then, Al ions 41 are implanted into the amorphous silicon layer 40 in the p-type MOSFET formation region using the photoresist layer 51 as an implantation mask.

Figure 4C:
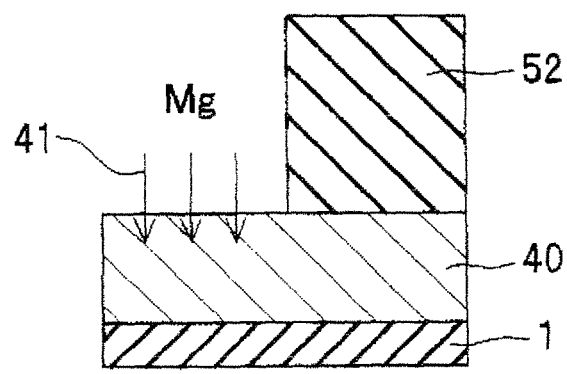
FIG. 4C is a cross-sectional view of a production step of the CMOS semiconductor device according to the fourth embodiment.

Step 3: As shown in FIG. 4C, the photoresist layer 51 is removed and then a photoresist layer 52 is formed in the p-type MOSFET formation region. Then, Mg ions 42 are implanted into the amorphous silicon layer 40 in the n-type MOSFET formation region, using the photoresist layer 52 as an implantation mask.

Figure 4D:
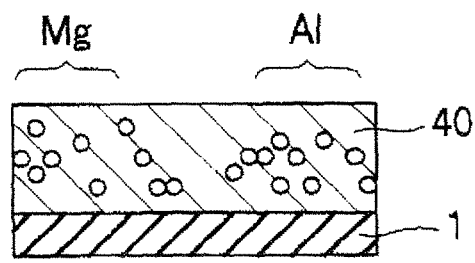
FIG. 4D is a cross-sectional view of a production step of the CMOS semiconductor device according to the fourth embodiment.

Step 4: As shown in FIG. 4D, the photoresist layer 52 is removed. Thus, the Mg ions are implanted in the n-type MOSFET formation region of the amorphous silicon layer 40 and the Al ions are implanted in the p-type MOSFET formation region thereof.

Figure 4E:
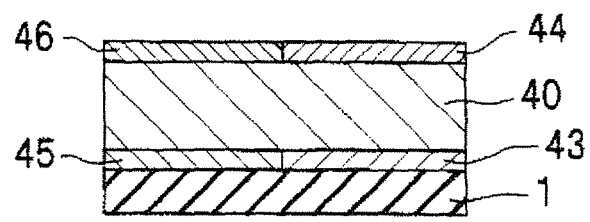
FIG. 4E is a cross-sectional view of a production step of the CMOS semiconductor device according to the fourth embodiment.

Step 5: As shown in FIG. 4E, a heat treatment is performed to segregate Mg and Al at an upper part and a lower part of the amorphous silicon layer 40. The heat treatment is performed at a processing temperature of 600° C. for a processing time of 30 seconds by a RTA method, for example. As a result, as shown in FIG. 4E, Mg segregated layers 45 and 46 are formed on the lower and upper parts of the amorphous silicon layer 40 in the n-type MOSFET formation region, and Al segregated layers 43 and 44 are formed on the lower and upper parts of the amorphous silicon layer 40 in the p-type MOSFET formation region.

Figure 4F:
FIG. 4F is a cross-sectional view of a production step of the CMOS semiconductor device according to the fourth embodiment.

Step 6: As shown in FIG. 4F, the Mg segregated layer 46, the Al segregated layer 44, and the amorphous silicon layer 40 are removed by wet etching with a KOH aqueous solution, for example.

Figure 4G:
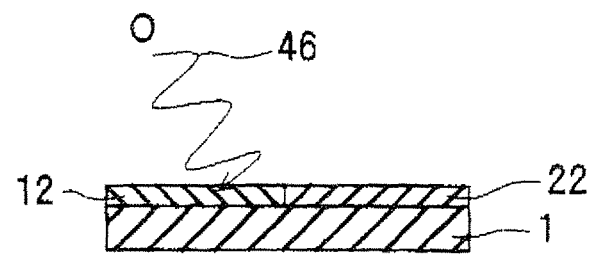
FIG. 4G is a cross-sectional view of a production step of the CMOS semiconductor device according to the fourth embodiment.

Step 7: As shown in FIG. 4G, the Mg segregated layer 45 and the Al segregated layer 43 are oxidized by plasma oxidization with oxygen plasma, whereby the cap layer 12 composed of MgO and the cap layer 22 composed of AlO are formed.

Figure 4H:
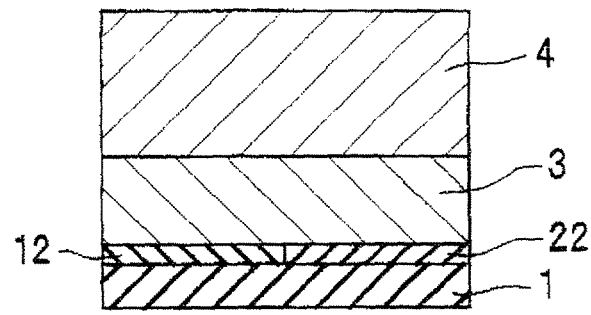
FIG. 4H is a cross-sectional view of a production step of the CMOS semiconductor device according to the fourth embodiment.

Step 8: As shown in FIG. 4H, the TiN layer 3 and the tungsten layer 4 are sequentially formed.

Finally, in the same step as step 11 (FIG. 1K) in the first embodiment, the TiN layer 3 and the tungsten layer 4 are etched at the same time, and the cap layers 12 and 22, and the insulation layer 1 are etched, whereby the gate electrodes are formed.

Figure 5A:
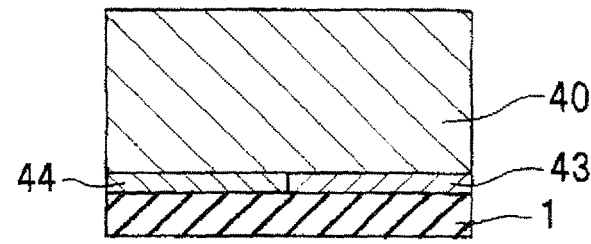
FIG. 5A is a cross-sectional view of a production step of another CMOS semiconductor device according to the fourth embodiment.
Figure 5B:
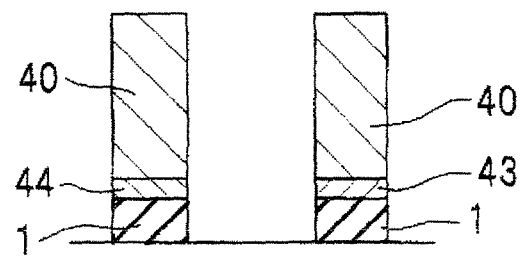
FIG. 5B is a cross-sectional view of a production step of another CMOS semiconductor device according to the fourth embodiment.
Figure 5C:
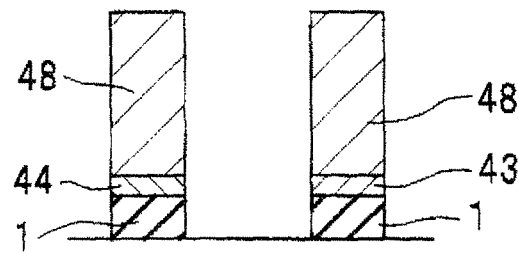
FIG. 5C is a cross-sectional view of a production step of another CMOS semiconductor device according to the fourth embodiment.

FIGS. 5A to 5C show a method for producing another CMOS semiconductor device according to the fourth embodiment.

According to this production method, after step 5 (FIG. 4E), only the Mg segregated layer 46 and the Al segregated layer 44 formed on the upper part of the amorphous silicon layer 40 are etched, and the amorphous silicon layer 40 remains.

Then, as shown in FIG. 5B, the amorphous silicon layers 40 in the n-type MOSFET formation region and the p-type MOSFET formation region are etched at the same time using a resist mask (not shown), for example. In addition, the Mg segregated layer 44, the Al segregated layer 43, and the insulation layer 1 are etched, whereby gate electrodes are formed.

Finally, a gate metal 48 composed of NiSi is formed by a reaction between amorphous silicon and nickel, using a step of producing a FUSI gate.

As described above, according to the production method according to the fourth embodiment, since the amorphous silicon layer is etched to form the gate electrodes of the n-type MOSFET formation region and the p-type MOSFET formation region at the same time, the process can be performed with a high degree of accuracy.

Fifth Embodiment

FIGS. 6A to 6H show a method for producing a CMOS semiconductor device according to a fifth embodiment. The production method includes the following steps 1 to 8. In the drawings, the same references as those in FIGS. 1A to 1K show the same or corresponding parts.

Figure 6A:
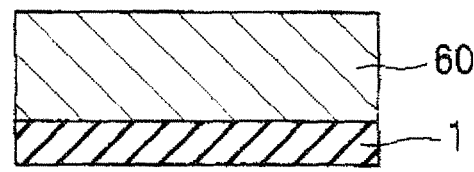
FIG. 6A is a cross-sectional view of a production step of a CMOS semiconductor device according to a fifth embodiment.

Step 1: As shown in FIG. 6A, the insulation layer 1 composed of HfSiON is formed on a semiconductor substrate (not shown) and then an amorphous silicon layer 60 is formed by the CVD method or the like.

Figure 6B:
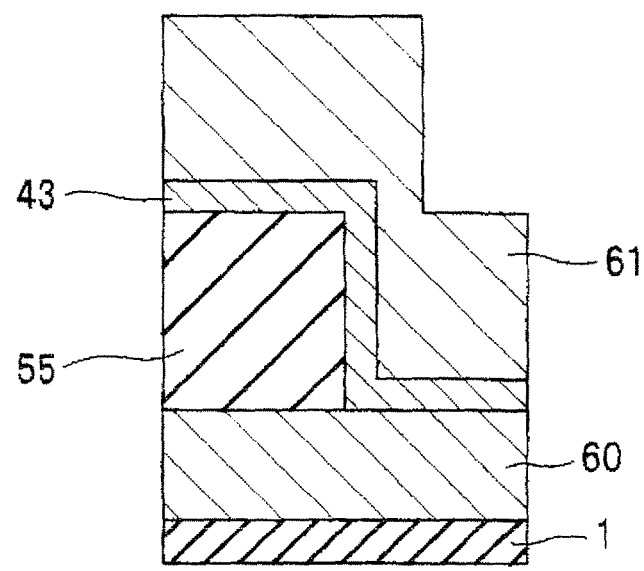
FIG. 6B is a cross-sectional view of a production step of the CMOS semiconductor device according to the fifth embodiment.

Step 2: As shown in FIG. 6B, a TEOS (or SiN) layer 55 is formed in the n-type MOSFET formation region. Then, an Al layer 43 and an amorphous silicon layer 61 are formed by the sputtering method or the CVD method.

Figure 6C:
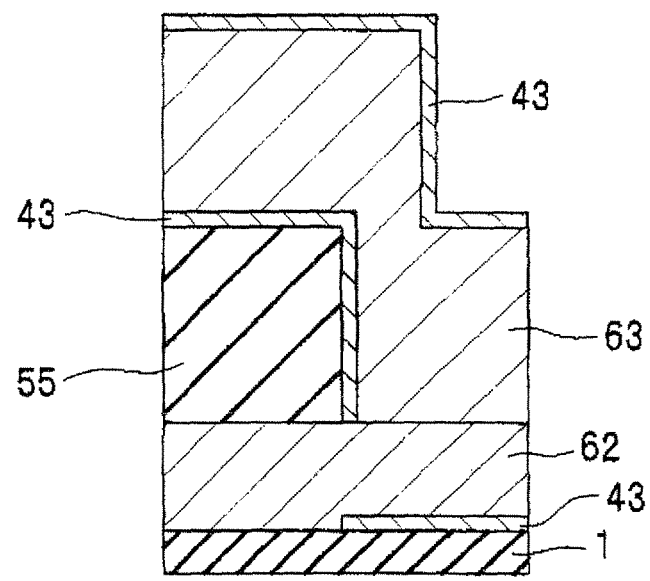
FIG. 6C is a cross-sectional view of a production step of the CMOS semiconductor device according to the fifth embodiment.

Step 3: As shown in FIG. 6C, a heat treatment is performed to diffuse Al, and the Al layer 43 is formed on a surface of a polycrystalline silicon layer 63 and on the insulation layer 1. In addition, in the heat treatment step, the amorphous silicon layer 61 becomes the polycrystalline silicon layer 63.

Figure 6D:
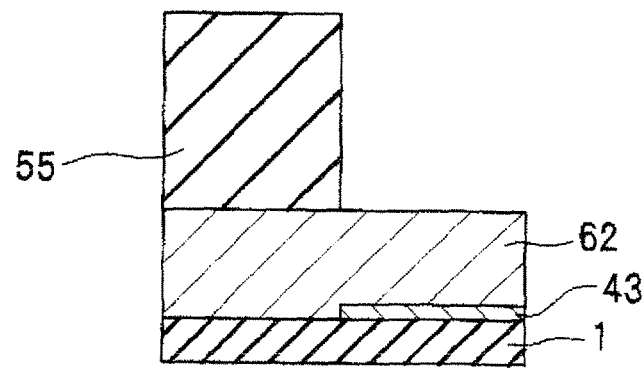
FIG. 6D is a cross-sectional view of a production step of the CMOS semiconductor device according to the fifth embodiment.

Step 4: As shown in FIG. 6D, the polycrystalline silicon layer 63 and the Al layer 43 are removed, so that the Al layer 43 remains only on the insulation layer 1 in the p-type MOSFET formation region.

Figure 6E:
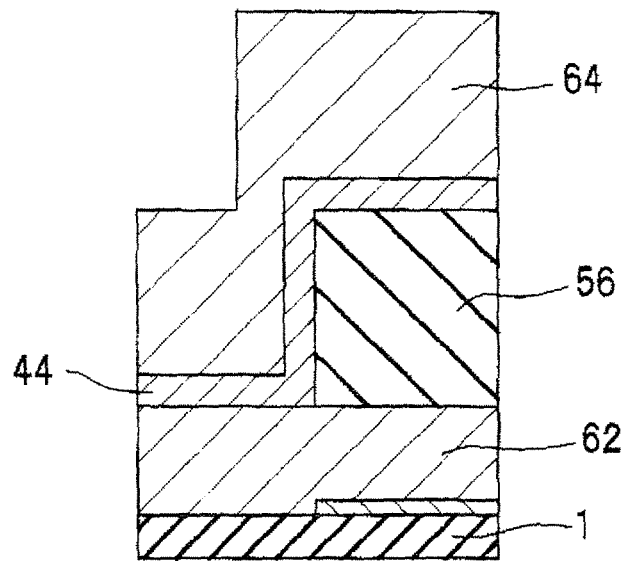
FIG. 6E is a cross-sectional view of a production step of the CMOS semiconductor device according to the fifth embodiment.

Step 5: As shown in FIG. 6E, the TEOS layer 55 is removed. Then, a TEOS layer 56 is formed in the p-type MOSFET formation region. Then, an Mg layer 44 and an amorphous silicon layer 64 are formed by the sputtering method or the CVD method.

Figure 6F:
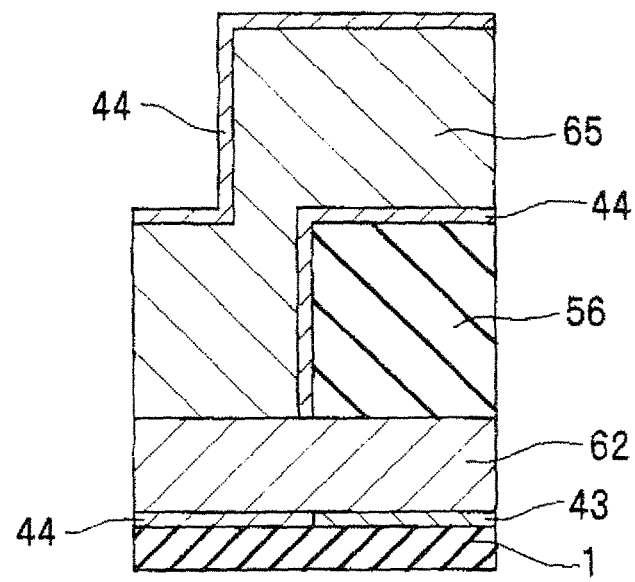
FIG. 6F is a cross-sectional view of a production step of the CMOS semiconductor device according to the fifth embodiment.

Step 6: As shown in FIG. 6F, a heat treatment is performed to diffuse Mg, and the Mg layer 44 is formed on a surface of a polycrystalline silicon layer 65 and on the insulation layer 1. In addition, in the heat treatment step, the amorphous silicon layer 64 becomes the polycrystalline silicon layer 65.

Figure 6G:
FIG. 6G is a cross-sectional view of a production step of the CMOS semiconductor device according to the fifth embodiment.

Step 7: As shown in FIG. 6G, the layers formed above the polycrystalline silicon layer 62 are all removed. Thus, there remain the insulation layer 1, the Mg layer 44 formed on the insulation layer 1 in the n-type MOSFET formation region, and the Al layer 43 formed on the insulation layer in the p-type MOSFET formation region. In addition, plasma oxidation is performed with oxygen plasma, so that the cap layer 12 composed of MgO and the cap layer 22 composed of AlO are formed.

Figure 6H:
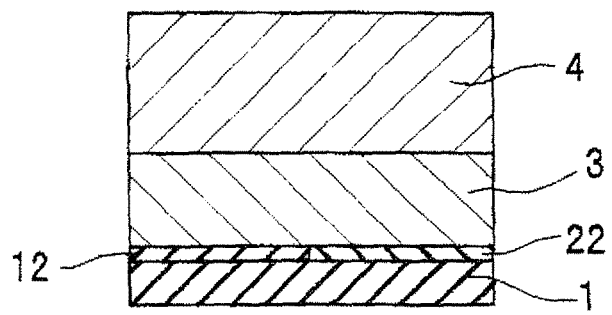
FIG. 6H is a cross-sectional view of a production step of the CMOS semiconductor device according to the fifth embodiment.

Step 8: As shown in FIG. 6H, the TiN layer 3 and the tungsten layer 4 are sequentially formed.

Finally, in the same step as step 11 (FIG. 1K) in the first embodiment, the TiN layer 3 and the tungsten layer 4 are etched at the same time, and then the cap layers 12 and 22, and the insulation layer 1 are etched, whereby gate electrodes are formed.

As described above, according to the production method according to the fifth embodiment, since the gate electrodes of the n-type MOSFET formation region and the p-type MOSFET formation region are formed at the same time, the processing can be implemented with a high degree of accuracy.

Sixth Embodiment

FIGS. 7A to 7F show a method for producing a CMOS semiconductor device according to a sixth embodiment. The production method includes the following steps 1 to 6. In the drawings, the same references as those in FIGS. 1A to 1K show the same or corresponding parts.

Figure 7A:
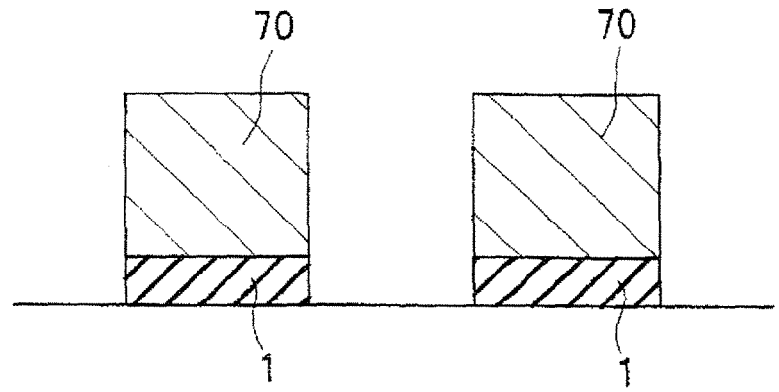
FIG. 7A is a cross-sectional view of a production step of a CMOS semiconductor device according to a sixth embodiment.

Step 1: As shown in FIG. 7A, a dielectric body composed of HfSiON or the like, and a polycrystalline silicon layer are laminated on the semiconductor substrate (not shown) composed of silicon, for example. Then, these are etched at the same time to form a gate electrode composed of the insulation layer 1 and a polycrystalline silicon layer 70 in each of the n-type MOSFET formation region and the p-type MOSFET formation region.

Since a gate metal of each gate electrode is composed of the polycrystalline silicon layer 70, the high-accuracy processing can be implemented by one etching step. For example, a gate length of the gate electrode is about 20 μm.

Figure 7B:
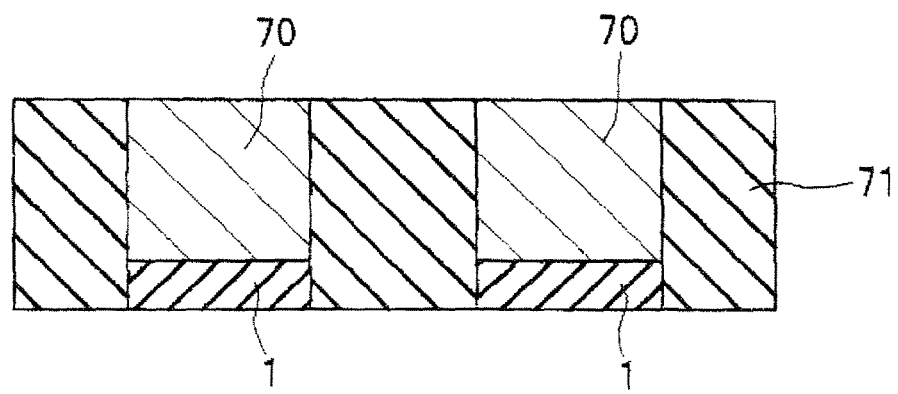
FIG. 7B is a cross-sectional view of a production step of the CMOS semiconductor device according to the sixth embodiment.

Step 2: As shown in FIG. 7B, a silicon oxide layer is formed on the whole surface by the CVD method, for example. Then, an upper surface is flattened by a CMP method, and an interlayer insulation layer 71 is formed.

Figure 7C:
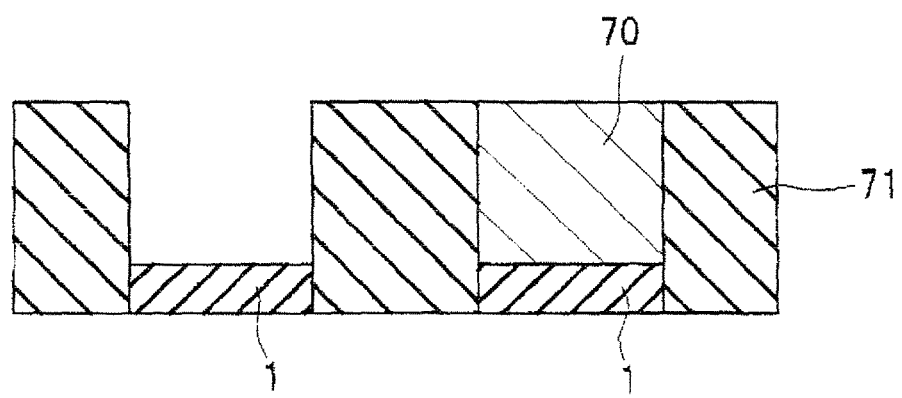
FIG. 7C is a cross-sectional view of a production step of the CMOS semiconductor device according to the sixth embodiment.

Step 3: As shown in FIG. 7C, a mask 72 (not shown in FIG. 7C) is formed in the p-type MOSFET formation region, and the polycrystalline silicon 70 in the n-type MOSFET formation region is selectively removed.

Figure 7D:
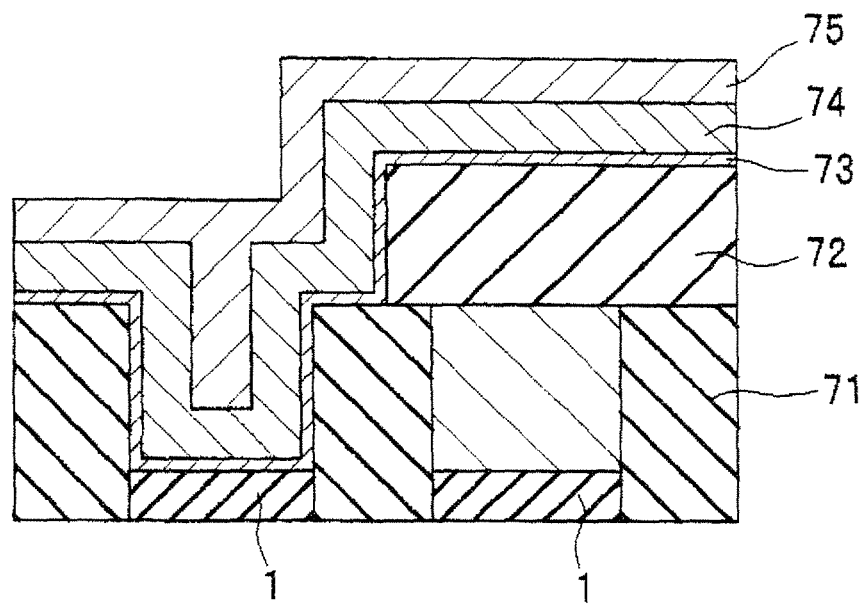
FIG. 7D is a cross-sectional view of a production step of the CMOS semiconductor device according to the sixth embodiment.

Step 4: As shown in FIG. 7D, a cap layer 73 composed of MgO, for example, a TaSiN layer 74, and a tungsten layer 75 are sequentially formed on the mask 72. These layers are formed by the ALD method, or the MOCVD method, for example.

Figure 7E:
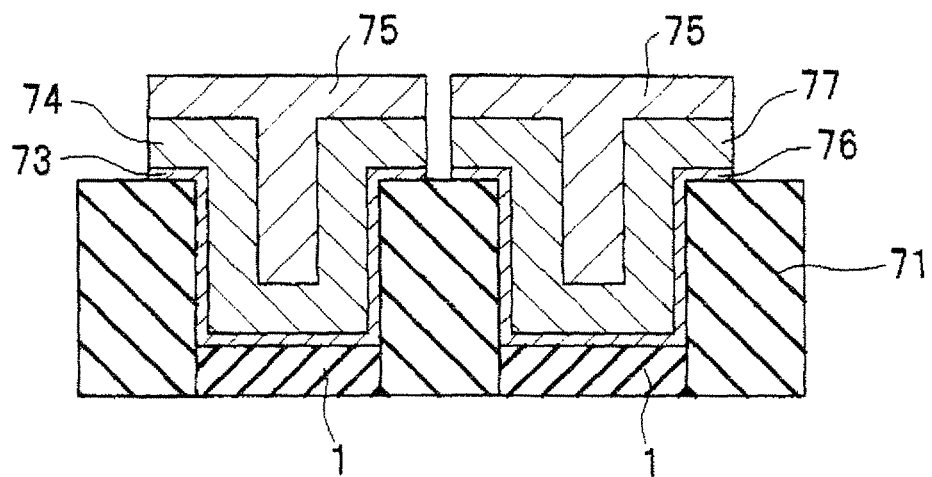
FIG. 7E is a cross-sectional view of a production step of the CMOS semiconductor device according to the sixth embodiment.

Step 5: As shown in FIG. 7E, the cap layer 73, the TaSiN layer 74, and the tungsten layer 75 are etched from the above. Then, a mask (not shown) is formed on the n-type MOSFET, and the polycrystalline silicon 70 of the p-type MOSFET is selectively etched. Then, a cap layer 76 composed of AlO, a Pt layer 77, and the tungsten layer 75 are formed.

Figure 7F:
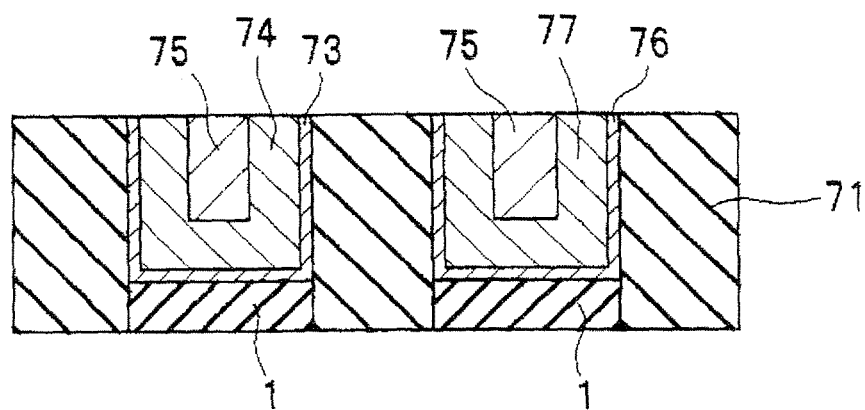
FIG. 7F is a cross-sectional view of a production step of the CMOS semiconductor device according to the sixth embodiment.

Step 6: As shown in FIG. 7F, after flattening the surface by the CMP method, the interlayer insulation layer 71 is removed, and a gate electrode (replacement gate) is formed in each of the n-type MOSFET formation region and the p-type MOSFET formation region.

When this production method is used, the metal material having low heat resistance can be selected as the gate metal material, so that a range of options to choose materials can be expanded.

In addition, when the control of the threshold voltage is not sufficient only by selecting the high-k material, the threshold voltage can be adjusted by appropriately selecting a material of the gate metal.

Seventh Embodiment

Figure 9:
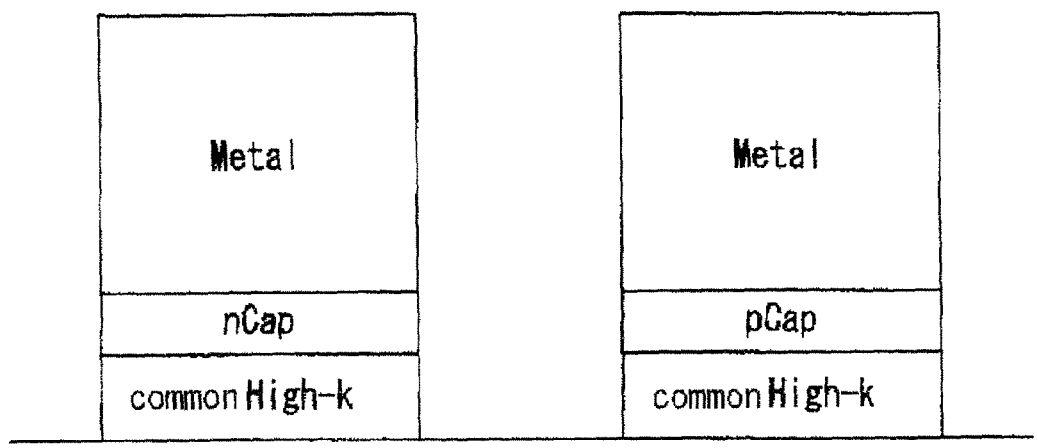
FIG. 9 is a structural drawing of gate electrodes of the CMOS semiconductor device described in the first to sixth embodiments.

According to the above embodiments 1 to 6, as shown in FIG. 9, the gate electrode of the n-type MOSFET and the gate electrode of the p-type MOSFET each have the insulation layer made of the common high-k material such as HfSiON, and the cap layer made of the different material such as nCap composed of LaO or MgO, for example, or pCap composed of AlO, for example. Thus, the threshold voltage is correctly controlled.

In addition, the metal layer (metal) formed on the cap layer is made of the same material in each gate electrode.

Alternatively, the gate electrodes of the n-type MOSFET and the p-type MOSFET may only have the same metal layer (metal) and have different insulation layers (n-high-k and p-high-k).

Figure 8:
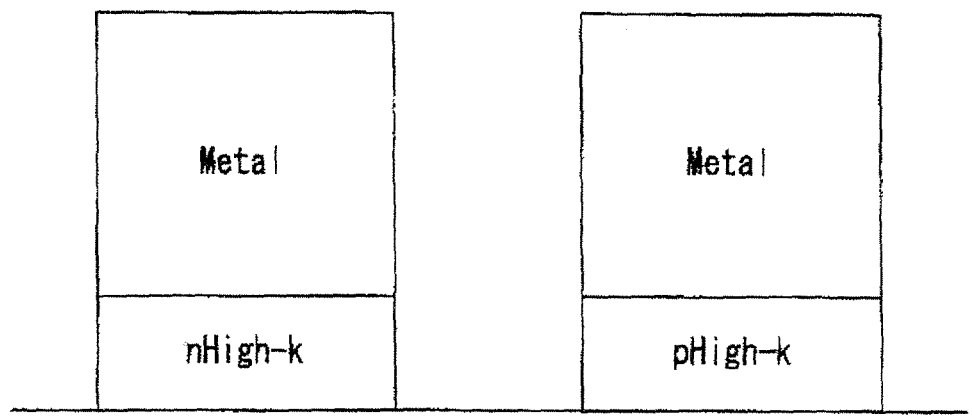
FIG. 8 is a structural drawing of gate electrodes of a CMOS semiconductor device according to a seventh embodiment.

For example, even when produced to have the structure as shown in FIG. 9, they finally have the structure as shown in FIG. 8 in some cases because the insulation layers composed of the common high-k materials react with the cap layers thereon by the heat treatment in the manufacturing step.

Specifically, the gate electrodes have the following stacked structures.

n-type MOSFET: W/TiN/HfMgO/Si substrate
p-type MOSFET: W/TiN/HfAlO/Si substrate

These structures are different from that in FIG. 9 in that the gate insulation layers have a two-layer structure instead of the one-layer structure.

In addition, as another structure, the gate electrodes may have the following structures.

n-type MOSFET: W/TiN/MgO/AlO/HfSiON/Si substrate
p-type MOSFET: W/TiN/AlO/MgO/HfSiON/Si substrate Thus, the cap layer may have a two-layer structure. In addition, AlO and MgO may be exchanged in a vertical direction.

In addition, an additional cap layer may be inserted to only one of the n-type MOSFET and the p-type MOSFET. In this case, the gate electrodes have the following stacked structures.

n-type MOSFET: W/TiN/MgO/HfSiON/Si substrate
p-type MOSFET: W/TiN//HfSiON/Si substrate Alternatively, $SiO_2$ or SiON is provided on the Si substrate, the cap layer is provided thereon, and the insulation layer composed of the high-k material such as HfSiON is provided thereon as follows.

n-type MOSFET: W/TiN/HfSiON/MgO/$SiO_2$ (SiON)/Si substrate
p-type MOSFET: W/TiN/HfSiON/AlO/$SiO_2$ (SiON)/Si substrate In this case, in the case where a vertical relationship of the insulation layer and the cap layer is reversed, the cap layer composed of MgO or AlO can be arranged at a position close to the Si substrate. As a result, the threshold voltage can be controlled more easily.

Eighth Embodiment

Figure 10A:
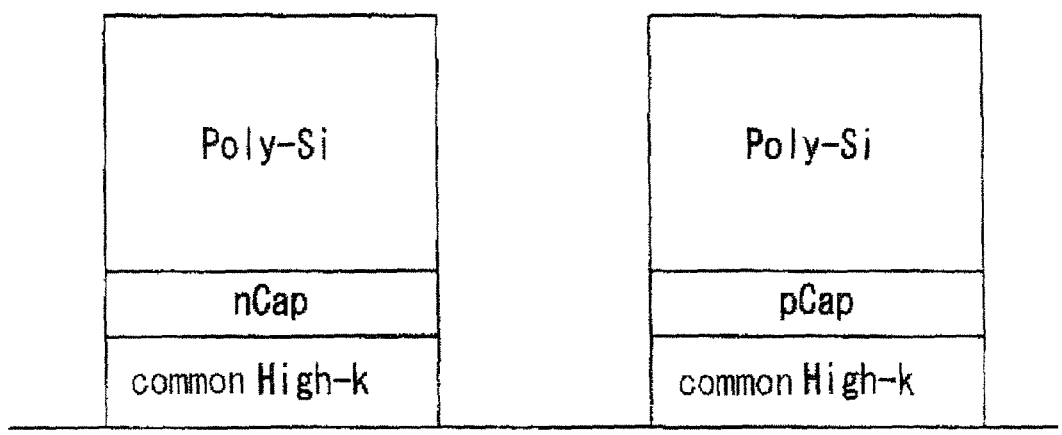
FIG. 10A is a schematic view of a production step of a CMOS semiconductor device according to an eighth embodiment.
Figure 10B:
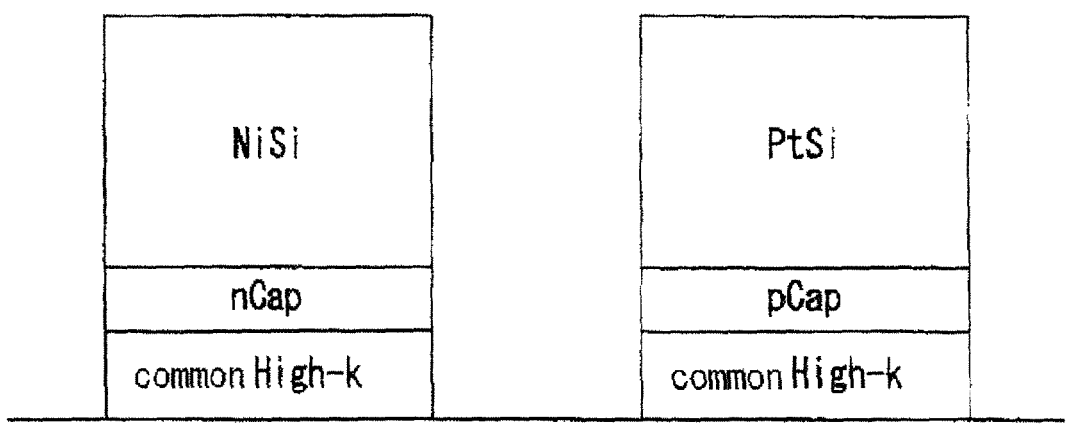
FIG. 10B is a schematic view of a production step of the CMOS semiconductor device according to the eighth embodiment.

After etching the gate electrode under the condition that both gate metals are composed of polycrystalline silicon as shown in FIG. 10A, a final structure may become as shown in FIG. 10B due to a reaction between polycrystalline silicon and Ni or Pt.

That is, the present invention is characterized in that since the gate electrodes of the n-type MOSFET and the p-type MOSFET are composed of the same gate metal, these gate electrodes can be formed at the same time in one etching step, so that the etching process can be performed with a very high degree of accuracy.

Therefore, as shown in FIG. 10A and FIG. 10B, after etching the gate metal, the materials of the gate metals may be different between the n-type MOSFET and the p-type MOSFET.

Specifically, the stacks at the time of etching of the gate electrode is as follows.
n-type MOSFET: Poly-Si/MgO/HfSiO/Si substrate
p-type MOSFET: Poly-Si/AlO/HfSiON/Si substrate
Then, the stacks of the final structure is as follows.
n-type MOSFET: FUSI/NiSi/MgO/HfSiO/Si substrate
p-type MOSFET: FUSI-PtSi/AlO/HfSiO/Si substrate In addition, while the gate electrode structure has been mainly described in this embodiment, the other structures such as the source/drain are the same as those of the CMOS semiconductor device 100 shown in FIG. 1. Furthermore, a HALO layer or an extension layer may be formed according to need.

Ninth Embodiment

Figure 11:
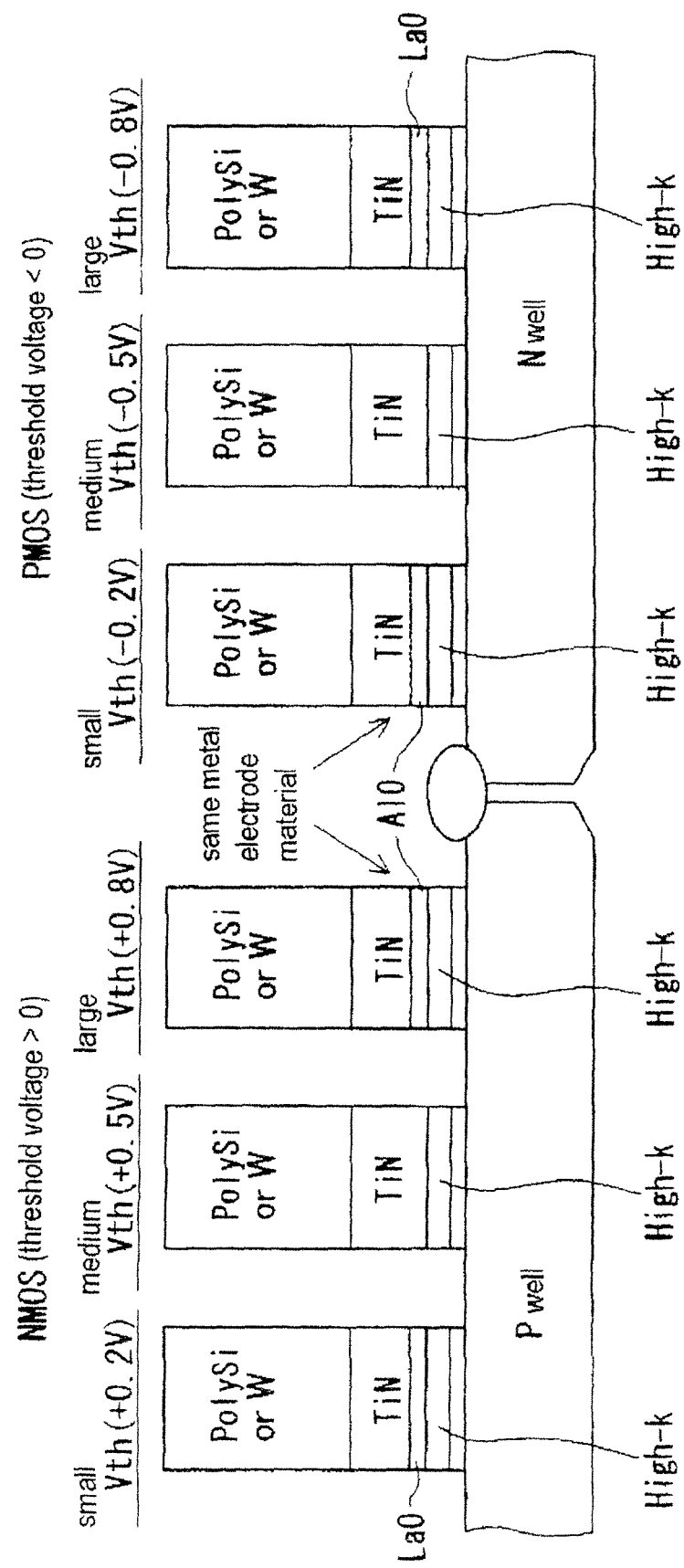
FIG. 11 is a structural drawing of gate electrodes of a CMOS semiconductor device according to a ninth embodiment.

FIG. 11 is a schematic view of a CMOS semiconductor device according to a ninth embodiment.

The CMOSFET has three kinds of structures as gate electrodes of n-type CMOSFETs as follows.
n-type MOSFET1: Poly-SI/TiN/LaO/HfSiO/Si substrate
n-type MOSFET2: Poly-SI/TiN/HfSiO/Si substrate
n-type MOSFET3: Poly-SI/TiN/AlO/HfSiO/Si substrate In addition, while a $SiO_2$ film is provided on the surface of the Si substrate in FIG. 11, it may be omitted.

As for the n-type MOSFETs 1 to 3, threshold voltages (Vth) are shifted to +0.2V (MOSFET1), +0.5V (MOSFET2), and +0.8V (MOSFET3) as compared with the structure in which the gate insulation layer is only composed of $SiO_2$.

On the other hand, three kinds of structures are used for gate electrodes of p-type CMOSFETs as follows.
p-type MOSFET1: Poly-SI/TiN/LaO/HfSiO/Si substrate
p-type MOSFET2: Poly-SI/TiN/HfSiO/Si substrate
p-type MOSFET3: Poly-SI/TiN/AlO/HfSiO/Si substrate As for the p-type MOSFETs 1 to 3, threshold voltages (Vth) are shifted to −0.2V (MOSFET1), −0.5V (MOSFET2), and −0.8V (MOSFET3) as compared with the structure in which the gate insulation layer is only composed of $SiO_2$.

Since these gate electrodes are each formed of the same gate metal material, they can be made through only one etching step, so that the gate electrode can be high in processing accuracy.

In addition, three kinds of gate electrodes having different shift amounts of the threshold voltages are provided in each of the n-type and p-type MOSFETs. Therefore, an integrated CMOS semiconductor device containing a plurality of MOSFETs having different threshold voltages can be produced by combining the six kinds of gate electrodes.

The invention claimed is:

1. A method of manufacturing a CMOS semiconductor device having a first transistor of a p-type field effect transistor and a second transistor of an n-type field effect transistor, the first transistor including a first gate insulation film provided over a first portion of a semiconductor substrate and a first gate electrode provided over the first gate insulation film,
the second transistor including a second gate insulation film provided over a second portion of the semiconductor substrate and a second gate electrode provide over the second gate insulation film,
the first and second gate electrode having metal layers of same metal material,
the method comprising the steps of
forming an insulation film over at least the first and second portions of the semiconductor substrate, the insulation film including hafnium;
forming a first cap layer over a third portion of the insulation film, the first cap layer having first material different from hafnium;
forming a second cap layer over a fourth portion of the insulation film; the second cap layer having second material different from the first material and hafnium; and
reacting by a heat treatment the insulating film with the first and second cap layers in the third and fourth portion, respectively, to form the first and second gate insulation films;
forming a gate metal layer on the semiconductor substrate; and
forming a gate metal layer of a gate electrode of each of the n-type MOSFET and the p-type MOSFET, by etching the gate metal material layer in a same etching step.

2. The method for producing a CMOS semiconductor device according to the claim 1, wherein
the first and second cap layers both have oxygen, and
the first material is aluminum while the second material is magnesium or lanthanum.

3. The method for producing a CMOS semiconductor device according to the claim 2, wherein
the step of forming the second cap layer is performed after the step of forming the first cap layer.

4. The method for producing a CMOS semiconductor device according to the claim 2, wherein
the first and second gate electrode each have titanium nitride.

5. The method for producing a CMOS semiconductor device according to the claim 1, wherein
the first cap layer is formed so as to be in direct touch with the third portion of the insulation film, and
the second cap layer is formed so as to be in direct touch with the fourth portion of the insulation film.

* * * * *